United States Patent
Xiao et al.

(10) Patent No.: US 10,253,962 B2
(45) Date of Patent: Apr. 9, 2019

(54) CONNECTOR AND LED LIGHTING DEVICE INCLUDING THE CONNECTOR

(71) Applicant: General Electric Company, Schenectady, NY (US)

(72) Inventors: Kun Xiao, Shanghai (CN); Zhifeng Bao, Xian (CN)

(73) Assignee: General Electric Company, Schenectady, NY (US)

( * ) Notice: Subject to any disclaimer, the term of this patent is extended or adjusted under 35 U.S.C. 154(b) by 444 days.

(21) Appl. No.: 14/870,503

(22) Filed: Sep. 30, 2015

(65) Prior Publication Data

US 2016/0273751 A1 Sep. 22, 2016

(30) Foreign Application Priority Data

Sep. 30, 2014 (CN) .......................... 2014 1 0519616

(51) Int. Cl.
*F21K 9/238* (2016.01)
*H05K 3/36* (2006.01)
(Continued)

(52) U.S. Cl.
CPC .............. *F21V 23/06* (2013.01); *F21K 9/232* (2016.08); *F21K 9/238* (2016.08); *F21V 23/006* (2013.01);
(Continued)

(58) Field of Classification Search
CPC ..... F21V 23/06; F21V 23/006; H01R 12/523; H01R 12/737; H01R 12/727; H01R 12/721; H05K 2201/1031
See application file for complete search history.

(56) References Cited

U.S. PATENT DOCUMENTS 4,085,998 A * 4/1978 Owens .................... H01R 9/09
439/59
4,257,668 A   3/1981 Ellis
(Continued)

FOREIGN PATENT DOCUMENTS

CN   201187736 Y   1/2009
CN   103542388 A   1/2014
(Continued)

OTHER PUBLICATIONS

Machine Translation and First Office Action and Search issued in connection with corresponding CN Application No. 201410519616.X dated Feb. 2, 2018.

*Primary Examiner* — William N Harris
(74) *Attorney, Agent, or Firm* — Peter T. DiMauro; GPO Global Patent Operation

(57) ABSTRACT

The present invention comprises a type of connector used to electrically connect a light source board and a driver board in LED lighting equipment, and the LED lighting equipment that uses this connector. The connector is mounted on the light source board, and comprises two or more conduction terminals, each of which comprises at least one flexible arm whose points of contact with the driver board can achieve an electronic connection between the light source board and the driver board. Compared to earlier models, the connector structure of the present invention is simple and easy to assemble and fabricate, facilitating large-scale automated production of LED lighting equipment and helping to reduce costs.

4 Claims, 9 Drawing Sheets

(51) Int. Cl.
*H05K 1/11* (2006.01)
*F21V 23/00* (2015.01)
*F21V 23/06* (2006.01)
*F21Y 115/10* (2016.01)
*H01R 33/945* (2006.01)
*H01R 33/09* (2006.01)
*H01R 12/73* (2011.01)
*H01R 12/72* (2011.01)
*H01R 12/57* (2011.01)
*F21K 9/232* (2016.01)
*F21Y 103/33* (2016.01)

(52) U.S. Cl.
CPC ............ *H01R 12/57* (2013.01); *H01R 12/737* (2013.01); *H01R 33/945* (2013.01); *H05K 3/366* (2013.01); *F21Y 2103/33* (2016.08); *F21Y 2115/10* (2016.08); *H01R 12/721* (2013.01); *H01R 33/09* (2013.01); *H05K 1/117* (2013.01); *H05K 2201/09063* (2013.01); *H05K 2201/1031* (2013.01); *H05K 2201/10106* (2013.01); *Y02P 70/611* (2015.11)

(56) References Cited

U.S. PATENT DOCUMENTS

| | | | |
|---|---|---|---|
| 4,732,565 A | 3/1988 | Ito | |
| 4,835,345 A | 5/1989 | Haarde | |
| 5,679,929 A | 10/1997 | Greenfield et al. | |
| 7,445,462 B2 | 11/2008 | Kim | |
| 8,419,225 B2 | 4/2013 | Zeng et al. | |
| 8,523,411 B2* | 9/2013 | Kawagoe | F21V 5/007 362/294 |
| 8,628,356 B2 | 1/2014 | Laurx et al. | |
| 9,212,801 B2* | 12/2015 | Leung | F21V 23/06 |
| 9,696,023 B2* | 7/2017 | Wang | F21V 23/06 |
| 10,088,112 B2* | 10/2018 | Crayford | F21V 23/045 |
| 2011/0095690 A1 | 4/2011 | Sagal | |
| 2015/0345766 A1* | 12/2015 | Wang | F21V 23/00 362/382 |
| 2016/0069547 A1* | 3/2016 | Chen | F21V 21/002 362/652 |
| 2016/0131355 A1* | 5/2016 | Grajcar | F21V 23/006 362/234 |
| 2016/0146442 A1* | 5/2016 | Fong | H01R 12/714 362/363 |

FOREIGN PATENT DOCUMENTS

| | | |
|---|---|---|
| CN | 103899953 A | 7/2014 |
| CN | 203771347 U | 8/2014 |
| WO | 2014094584 A1 | 6/2014 |

* cited by examiner

CONNECTOR AND LED LIGHTING DEVICE INCLUDING THE CONNECTOR

TECHNICAL FIELD

The present invention relates to the field of lighting technology. It specifically relates to a type of connector that electrically connects a light source and a driver board, and the LED lighting equipment that uses said connector.

BACKGROUND TO THE INVENTION

In the conventional technology, the electrical connection between the light source board and driver board in LED lighting equipment is achieved with a wire, each of whose ends are separately soldered onto the light source board and driver board by hand, thus supplying the LED light source on the light source board with electricity. This method of electrical connection requires much time and effort, there is no way to achieve automatic assembly, and it is also unreliable and is easy to short-circuit.

In order to improve the connection between the light source board and driver board, technicians have developed a variety of direct plug-in connectors. For example, the two types of connector disclosed in patent applications CN201210562730.1 and CN201310527555.7 both of which are incorporated by reference. Direct plug-in connectors use sockets mounted on the light source board and pins mounted on the driver board make a connection, simplifying the conventional process of connecting wires by hand. Thus the task of connecting wires is made more convenient, and automatic assembly is made possible. However, there still remain problems with existing direct plug-in connectors. These can include complex structure, relatively high cost and low adaptability. For example, existing connectors use metal with plastic insulation material, making design and fabrication complex; thus requiring a high level of precision for assembly; therefore, the scrap rate is high. Furthermore, the creepage distance is not adjustable so the connectors are not adaptable to different sizes of LED lighting equipment and thus has low adaptability.

BRIEF DESCRIPTION OF THE INVENTION

In view of the above, one aspect of the present invention is to provide a connector to electrically connect a light source board to a driver board of various types of LED lighting equipment. The light source board has at least one through-hole that allows a part of the driver board to pass through it. The part of the driver board that passes through the light source board has at least two connection points used to electrically connect it with the connector. This connector further comprises two or more conduction terminals, each terminal comprising two or more mounting parts that fix the conduction terminals to the light source board, one supporting portion that connects said two or more mounting parts, and one flexible arm that electrically connects the conduction terminals with the part of the driver board that passes through the light source board. The shape and size of the conduction terminals of the present invention can be adjusted to different requirements, for example according to the size of current or creepage distance so that it can be adapted to all types of LED lighting equipment.

The connector as described above further flexibly connects a flexible arms with contact points on the part of the driver board that passes through the light source board, thus achieving an electrical connection between the conduction terminal and the driver board.

With regard to the connector in the present invention, at least one flexible arm is of a cantilever form that comprises one fixed end and one free end, with the fixed end connected to one of the mounting parts of the conduction terminal or the supporting portion, thus fastening it, while the free end extends towards the side and is used to connect the contact point on the part of the driver board that passes through the light source board. In one of the embodiments of the cantilever, its fixed end and one of its mounting parts are connected or close, and the free end of the cantilever extends towards the through-hole of the light source board, connecting with the contact points on the part of the driver board that passes through the light source board. In another embodiment the fixed end of the cantilever forms a connection with the supporting portion and is at a distance from either of the mounting parts. The free arm of the cantilever extends towards the through-holes on the light source board, and forms a connection with the contact point on the part of the driver board that passes through the light source board. The cantilever can assume any shape, for example a sheet or rod etc., and can be straight or curved. In addition, when it does not affect the connecting function of the supporting portions, the cantilever may be formed by bending part of the supporting portion.

In another embodiment of the connector, at least one conduction terminal also comprises a second flexible arm. This arm, the mounting part and/or the supporting portion make a connection and make a flexible connection with the part of the driver board that passes through the light source board, fixing the driver board in position. The first and second flexible arms both make a connection with the part of the driver board that passes through the light source board, making the connection between the driver board and the light source board on the structure more secure. It is also possible that the two flexible arms could separately form a connection with the two sides of the part of the driver board that passes through the light source board. It is also possible for the two flexible arms to be the same shape and symmetric on the driver board.

In another embodiment of the connector, at least one of the terminal ends could be wholly fabricated from conductive metal, for example using sheet metal stamping.

Another aspect of the present invention allows for the provision of LED lighting equipment. This aspect can comprise: A light source board on which there is at least one LED light and at least one through-hole. It may further comprise, one driver board, part of which can pass through the through-hole of the light source board. The part of the driver board that passes through the light source board can have at least two contact points on it. It may further comprise a connector that is mounted on the light source board that is configured to achieve an electrical connection between the light source board and the driver board. The connector may further comprise said connector comprising two or more conduction terminals, each terminal comprising at least one mounting part that fixes the conduction terminal to the light source board, and one flexible arm that electrically connects the conduction terminal with the contact points on the part of the driver board passes through the light source board. Further, a part of the driver board can pass through the light source board; so that the driver board does not have any connecting contact pins. This results in the desirable property of simplifying the structure and easing the assembly of the LED lighting equipment.

In another embodiment, each of the conduction terminals of its connector comprises two or more mounting parts that fix the conduction terminals onto the light source board, one supporting portion that connects two or more mounting parts, and one flexible arm that electrically connects the conduction terminals with the contact points on the part of the driver board that passes through the light source board.

In another embodiment, the part of the driver board that passes through the light source board is a protruding part that is narrower than the entire width of the driver board. Thus, the whole driver board is shaped like an inverted "T". The protruding part has at least two contact points on it, while the light source board may also have a through-hole that allows the protruding part of the driver board to pass through it.

In another embodiment, the part of the driver board that passes through the light source board may comprise two or more protruding parts, each protruding part having a separate contact point. The light source board may further comprise a through-hole that allows the protruding parts of the driver board to pass through it. In an alternative embodiment, the light source board may further comprise the same number of through-holes as protruding parts of the driver board, allowing each protruding part to pass through the light source board separately.

In a final example embodiment, the two contact points on the driver board further comprise the welding spots on the surface of the driver board, such as solder points or metal parts on the driver board.

DETAILED DESCRIPTION OF THE INVENTION

The following combination of diagrams and detailed descriptions describe the present invention in further detail.

Figure 1:
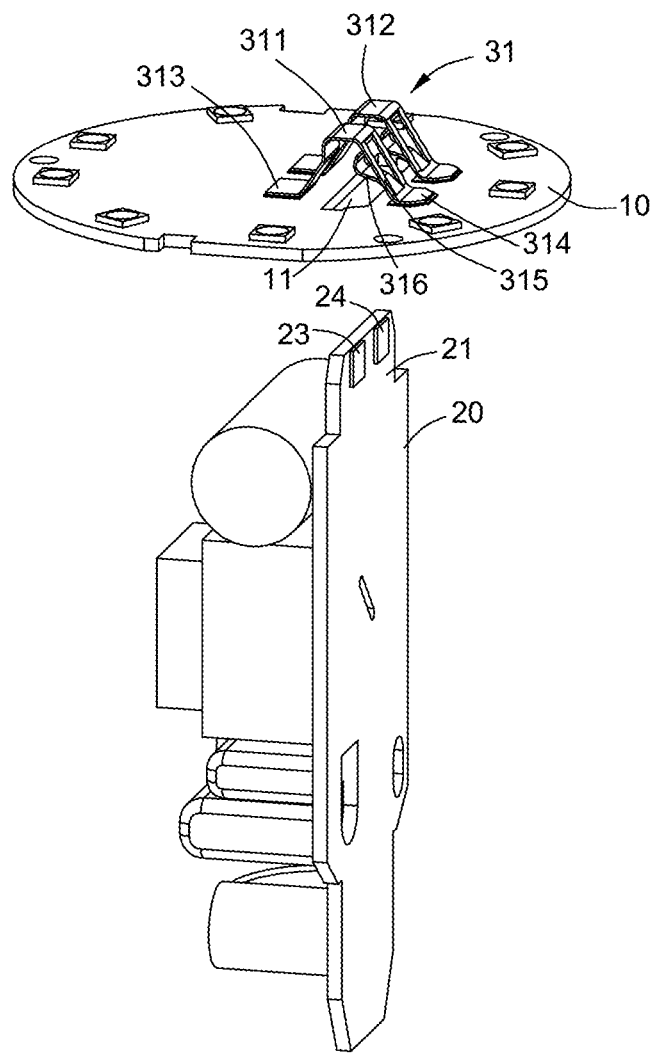
FIG. 1 is a schematic of the light source board and driver board in an unconnected state.

FIG. 1 shows an example non-limiting embodiment of the connector in the present invention. Connector 31 is used to connect the light source board 10 and driver board 20. Light source board 10 has a through-hole 11, the driver board 20 has a protruding part 21 that is narrower compared with the width of the whole driver board 20. One side of protruding part 21 has two contact points 23 and 24. The connector 31 is mounted on light source board 10, comprises two conduction terminals 311 and 312. Conduction terminals 311 and 312 are wholly fabricated from a conductive metal. Conduction terminal 311 further comprises two mounting parts, 313 and 314, a supporting portion 315, and a flexible arm 316. The mounting parts 313 and 314 are positioned on the two sides of the light source board's through-hole 11 and are used to fix conduction terminal 311 onto light source board 10. Supporting portion 315 is used to connect mounting parts 313 and 314; flexible arm 316 is formed by bending part of the supporting portion 315 towards through-hole 11. Specifically, part of the supporting portion 315 bends with the point of contact between supporting portion 315 and mounting part 314 as the axis.

Figure 2:
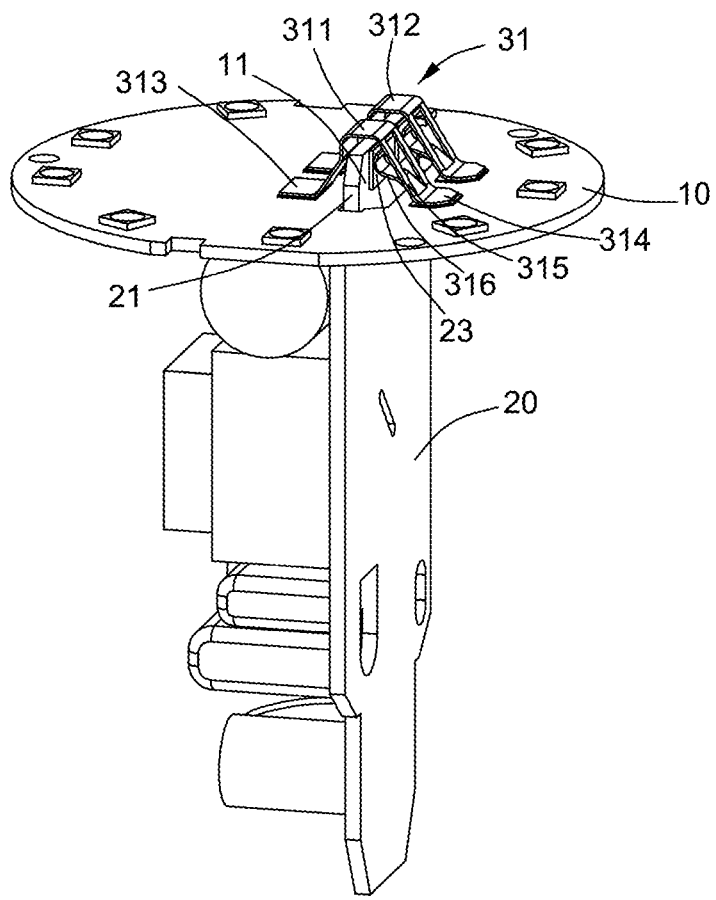
FIG. 2 is a schematic of the light source board and driver board in an electrically connected state.
Figure 3:
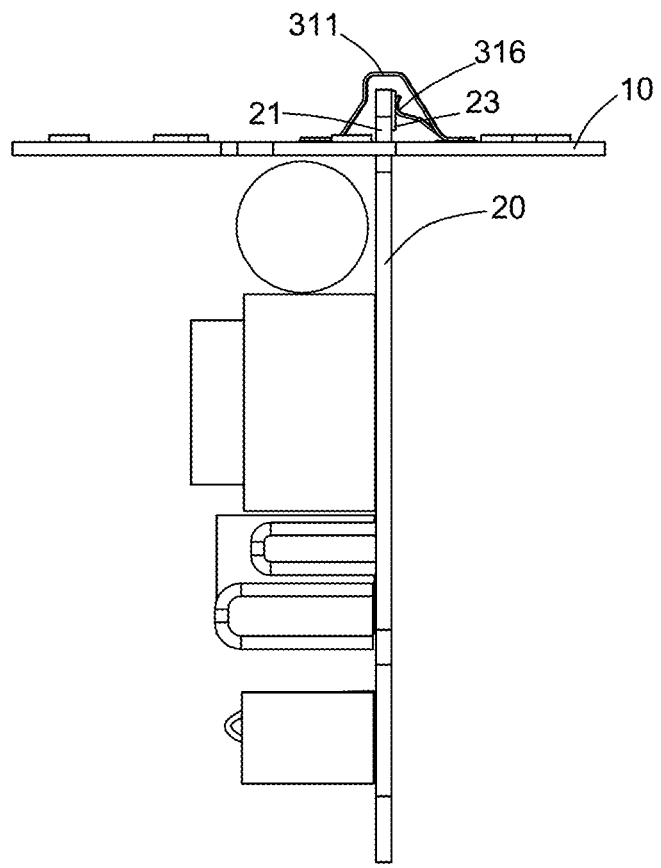
FIG. 3 is the front view of FIG. 2.

As FIG. 2 and FIG. 3 show that when the protruding part 21 of the driver board 20 passes through the light source board's through-hole 11, flexible arm 316 and contact point 23 on the driver board make a connection achieving an electrical connection between conduction terminal 321 and the driver board 20. In this embodiment, conduction terminals 312 have the same structure as conduction terminal 311 The flexible arm of conduction terminal 312 and the contact point 24 on the driver board make a connection, achieving an electrical connection between conduction terminal 312 and driver board 20, thus achieving an electrical connection between light source board 10 and driver board 20.

Figure 4:
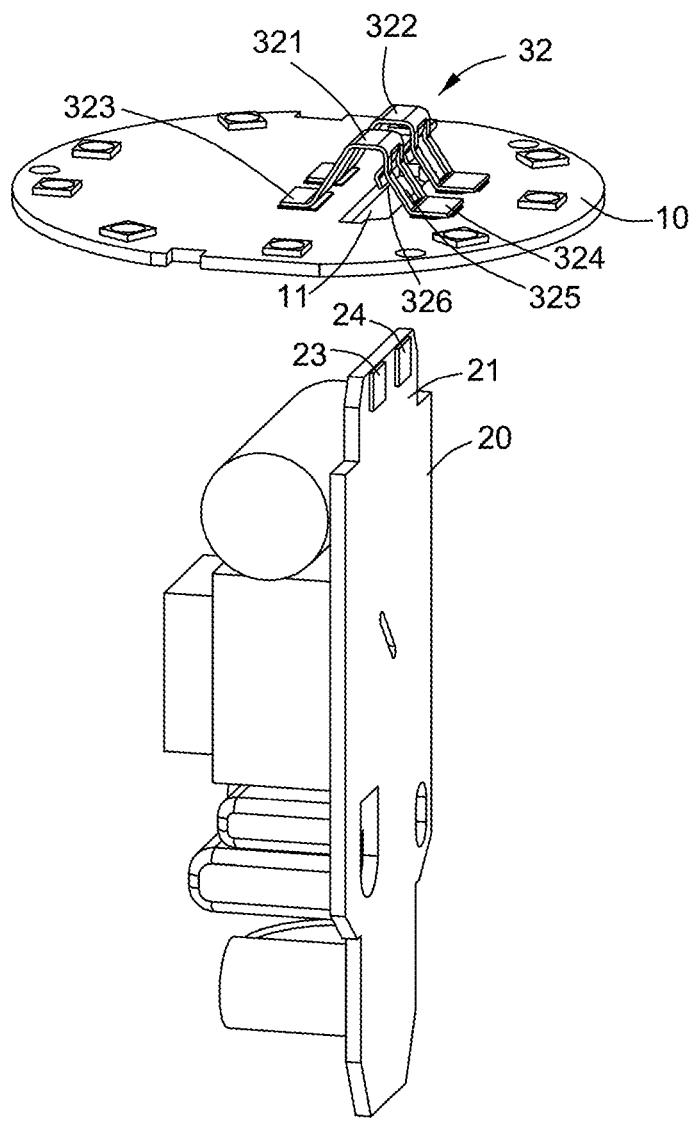
FIG. 4 is a schematic of the light source board and driver board in an unconnected state.
Figure 5:
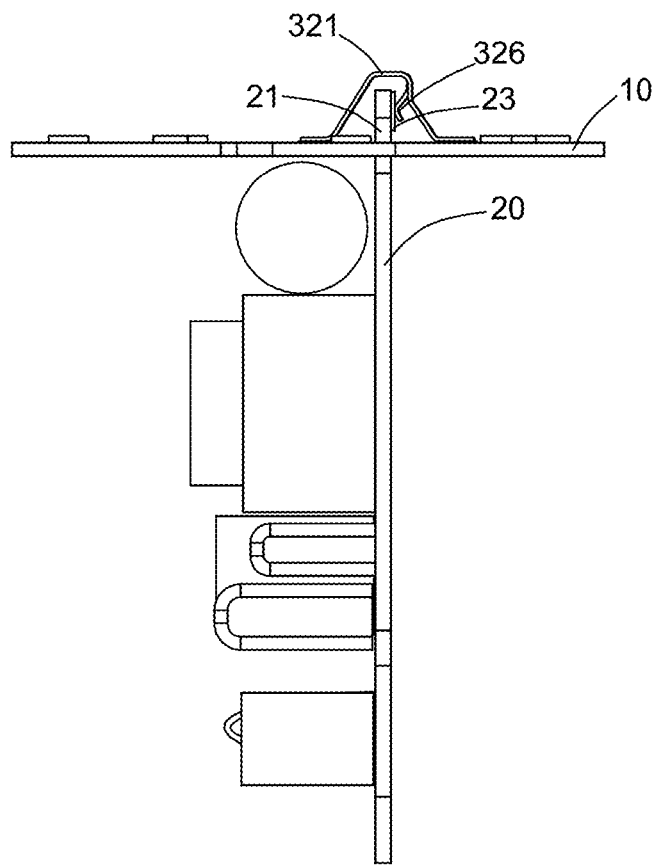
FIG. 5 is the front view of FIG. 4, the light source board and the driver board in a connected state.

FIGS. 4 and 5 show another embodiment of the connector. Connector 32 is used to connect light source board 10 and driver board 20. FIGS. 4 and 5 respectively schematically illustrate the front view of the light source board 10 and driver board 20 in an unconnected state and in a connected state. The structure of the connector 32 is similar to connector 31. The difference is between the methods of forming the flexible arms of the conduction terminals. Connector 32 comprises two conduction terminals 321 and 322. As ab example, 321 further comprises two mounting parts 323 and 324, one supporting portion 325 and one flexible arm 326, of which mounting parts 323 and 324 are positioned on the two sides of through-hole 11, and are used to fix conduction terminal 321 onto light source board 10. Supporting portion 325 is used to connect mounting parts 323 and 324, and flexible arm 326 is formed by bending part of supporting portion 325 towards through-hole 11. Part of the supporting portion 325 bends with the point on the supporting portion 325 at a distance from the mounting parts 323 and 324 as its axis. When the protruding part 21 of driver board 20 passes through through-hole 11, the connection between flexible arm 326 and contact point 23 on the driver board achieve an electrical connection. In this example embodiment, conduction terminal 322 has the same structure as conduction terminal 311.

Figure 6:
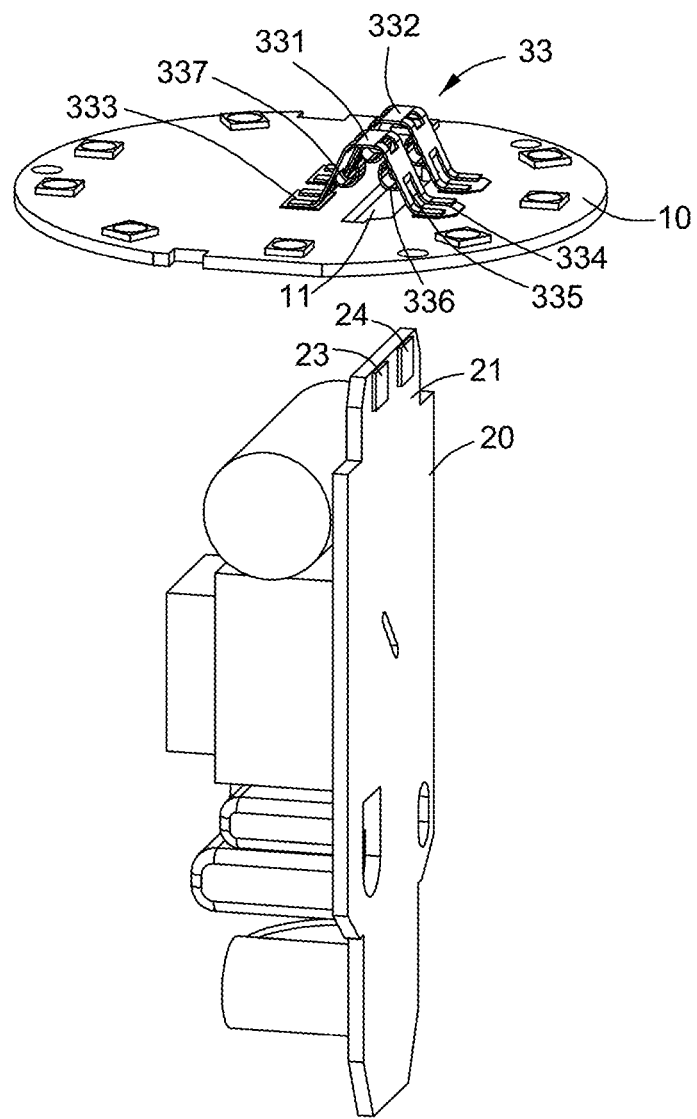
FIG. 6 is a schematic of the light source board and driver board in an unconnected state.
Figure 7:
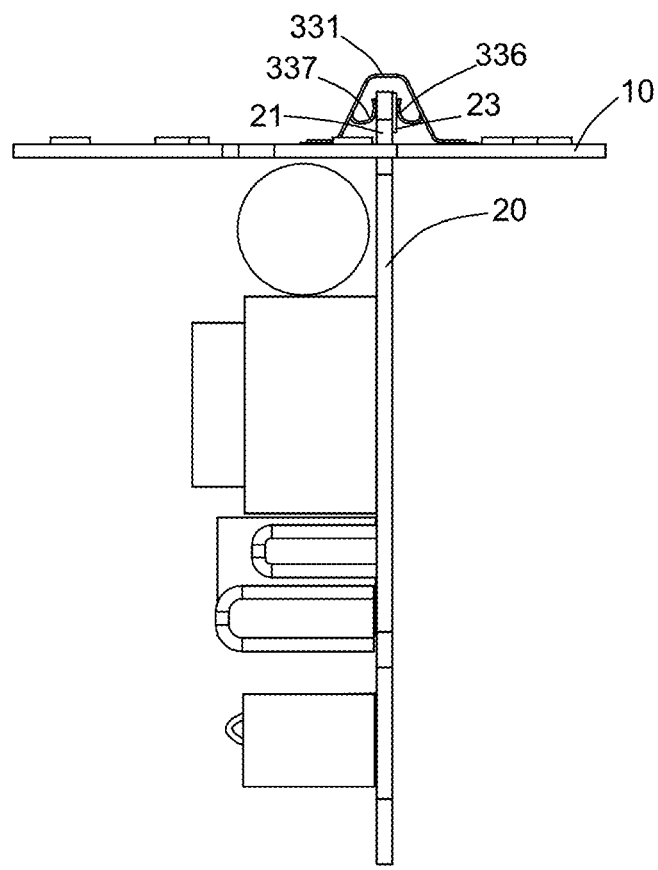
FIG. 7 is the front view of FIG. 6, the light source board and the driver board in an electrically connected state.

FIGS. 6 and 7 show another embodiment of the connector. Connector 33 is used to connect light source board 10 and driver board 20. FIGS. 6 and 7 respectively illustrate front view of light source board 10 and driver board 20 in an unconnected state and in a connected state. Connector 33 comprises two conduction terminals 331 and 332. Conduction terminal 331, as an example, further comprises two mounting parts 333 and 334, one supporting portion 335 and two flexible arms 336 and 337, whose mounting parts 333 and 334 are positioned on the two sides of through-hole 11 and are used to fix conduction terminal 331 onto the light source board 10. Supporting portion 335 is used to connect mounting parts 333 and 334. Flexible arm 336 is formed by bending part of supporting portion 335 towards through-hole 11. The part of supporting portion 335 close to mounting part 334 bends, with the point on the supporting portion 335 at a distance from the mounting part 334 as its axis. Flexible arm 337 is similar in shape to flexible arm 336; the part close to mounting part 333 bends towards through-hole 11, with the point of supporting portion 335 that is at a distance from mounting part 333 as its axis. As FIG. 7 shows, when the protruding part 21 of driver board 20 passes through through-hole 11, flexible arm 336 and contact point 23 on the driver board connect achieving an electrical connection, at the same time, flexible arm 337 forms a connection on the other side of the protruding part 21 of the driver board. The two flexible arms 336 and 337 appear to make a symmetric structure on the two sides of the driver board. In this embodiment, conduction terminal 332 has the same structure as conduction terminal 331. Compared with connectors 31 and 32 in the first and second embodiments, conduction terminals 331 and 332 of connector 33 both have two flexible arms, and can achieve a more stable connection between light source board 10 and driver board 20.

Figure 8:
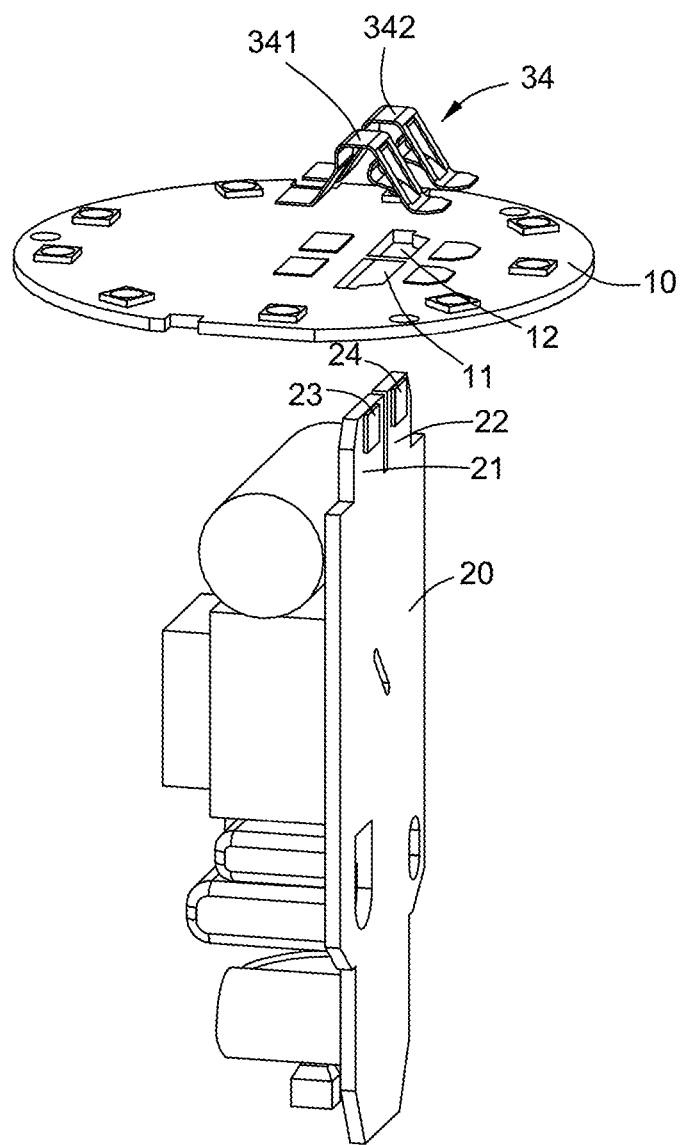
FIG. 8 is a schematic of the light source board and driver board in an unconnected state.

FIG. 8 shows another example embodiment of the connector in the present invention. Connector 34 is used to connect light source board 10 and driver board 20. FIG. 8 is a schematic of light source board 10 and driver board 20 in an unconnected state. The structure of connector 34 is similar to that of connector 31, comprising two conduction terminals 341 and 342. The difference is light source board 10 has two through-holes 11 and 12, and driver board 20 has two protruding parts 21 and 22, each with its own contact point, 23 and 24. Each of the protruding parts 21 and 22 pass through through-holes 11 and 12, causing contact points 23 and 24 to make separate flexible connections with the flexible arms of conduction terminals 341 and 342, in this way achieving an electrical connection between light source board 10 and driver board 20.

Figure 9:
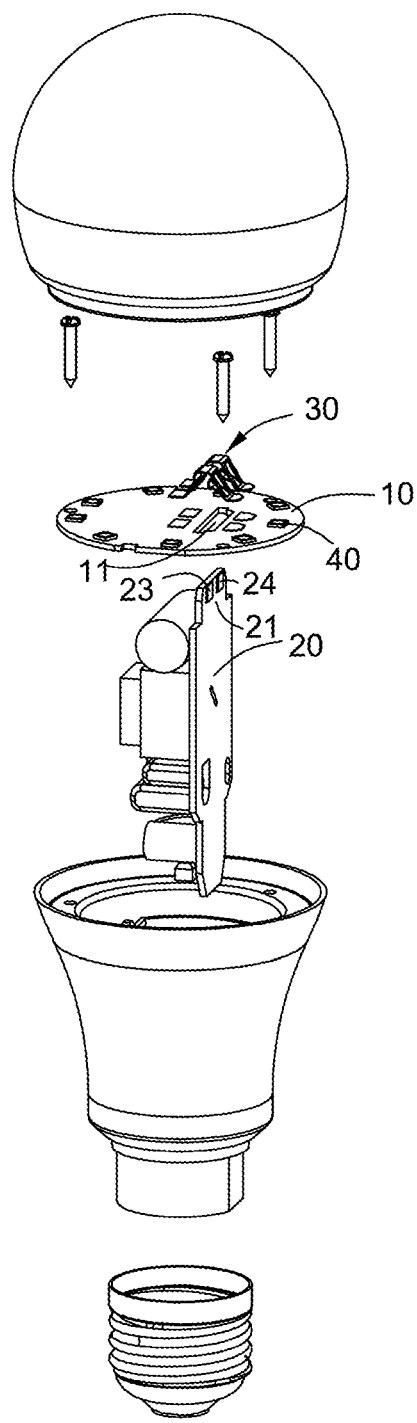
FIG. 9 is an exploded view of the LED lighting equipment in the present invention.

FIG. 9 is an exploded diagram showing an example embodiment of LED lighting equipment. This example embodiment comprises a light source board 10, driver board 20 and a connector 30 that is mounted on light source board 10. Light source board 10 has multiple LED lights 40 and one through-hole 11, driver board 20 has a protruding part 21 that is narrower than the entire width of driver board 20. There are two contact points 23 and 24 on protruding part 21; connector 30 has the same structure as connector 31. Passing protruding part 21 of the driver board through through-hole 11 can cause contact points 23 and 24 to make separate connections with the flexible arms of the two conduction terminals of connector 30, thus achieving an electrical connection between light source board 10 and driver board 20.

This detailed description of the various embodiments makes clear the many modifications and variations that may be made to the present invention. Therefore, it should be recognized that the appended claims are intended to cover all such modifications and variations as fall within the true spirit and scope of the invention.

We claim that:

1. LED lighting equipment comprising:
a light source board on which there is at least one LED light and has two through-holes;
a driver board, the driver board has two protruding parts, each of which can pass through the two through-holes of the light source board;
wherein each protruding part of the driver board that passes through the light source board has a separate contact point;
one connector mounted on the light source board configured to achieve an electrical connection between the light source board and the driver board, the connector comprising two conduction terminals, each terminal further comprising at least one flexible arm that electrically connects the contact point on each protruding part of the driver board that passes through the light source board and a mounting part on the conduction terminal that is fixed on the light source board.

2. The LED lighting equipment according to claim 1, wherein each conduction terminal comprises two or more mounting parts that fix the conduction terminal onto the light source board, one supporting portion that connects the two or more mounting parts, and one flexible arm that electrically connects the conduction terminal and the contact point on each protruding part of the driver board that passes through the light source board.

3. The LED lighting equipment according to claim 1, wherein the part of the driver board that passes through the light source board is a protruding part that is narrower than an entire width of the driver board; on this protruding part there are at least two connection points, and the through-hole of the light source board that causes the protruding part of the driver board to pass through it.

4. The LED lighting equipment according to claim 1, wherein the contact points on the driver board are metal parts or welding spots on a surface of the driver board.

* * * * *